(12) United States Patent
Chakraborty et al.

(10) Patent No.: US 9,176,188 B2
(45) Date of Patent: Nov. 3, 2015

(54) WAVEFORM CALIBRATION USING BUILT IN SELF TEST MECHANISM

(71) Applicants: Texas Instruments Incorporated, Dallas, TX (US); Texas Instruments Deutschland GMBH, Freising (DE)

(72) Inventors: Sudipto Chakraborty, Richardson, TX (US); Jens Graul, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 14/137,994

(22) Filed: Dec. 20, 2013

(65) Prior Publication Data

US 2015/0177326 A1  Jun. 25, 2015

(51) Int. Cl.
*H04B 3/46* (2015.01)
*G01R 31/317* (2006.01)
*H04B 17/00* (2015.01)

(52) U.S. Cl.
CPC ...... *G01R 31/31716* (2013.01); *H04B 17/0005* (2013.01); *H04B 17/0007* (2013.01)

(58) Field of Classification Search
CPC ........... H04B 17/0007; H04B 17/0005; H04B 17/20; H04B 1/30; H04L 27/0014; H04L 27/0016; H04L 27/0024; G01R 31/31716
See application file for complete search history.

(56) References Cited

U.S. PATENT DOCUMENTS

| | | | |
|---|---|---|---|
| 2004/0203472 A1* | 10/2004 | Chien | 455/68 |
| 2008/0144707 A1* | 6/2008 | Tsfati et al. | 375/224 |
| 2011/0018640 A1* | 1/2011 | Liang et al. | 330/297 |
| 2012/0252382 A1* | 10/2012 | Bashir et al. | 455/114.3 |

OTHER PUBLICATIONS

Robert Bogdan Stasaewski et al, "All-Digital TX Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.
Bogdan A. Georgescu et al, "A 0.18um CMOS Bluetooth Frequency Synthesizer for Integration with a Bluetooth SOC Reference Platform", The 3rd IEEE International Workshop on System-on-Chip for Real-Time Applications, Jun. 30-Jul. 2, 2003, pp. 258-263.
"2.4-GHz Bluetooth Low Energy and Proprietary System-on-Chip", CC2541, SWRS110C, Texas Instruments Incorporated, Jan. 2012, revised Nov. 2012, pp. 1-33.
Haitao Gan, "On-Chip Transformer Modeling, Characterization, and Applications in Power and Low Noise Amplifiers", Ph.D. Thesis, Stanford University, Mar. 2006, pp. 1-120.
Sudipto Chakraborty, "Transceiver with Asymmetric Matching Network", U.S. Appl. No. 13/748,008, filed Jan. 23, 2013, pp. 1-34.

* cited by examiner

*Primary Examiner* — Syed Haider
(74) *Attorney, Agent, or Firm* — John R. Pessetto; Frank D. Cimino

(57) ABSTRACT

A system on a chip (SoC) includes a transceiver comprising a transmitter having a power amplifier and a receiver having a signal buffer. At least one of the transmitter and receiver has a configurable portion that can be configured to produce a range of waveforms (both in waveshape as well as duty cycle). A low cost built in self test (BIST) logic is coupled to the transceiver. The BIST logic is operable to calibrate the configurable portion of the transceiver to produce a waveform that has a selected harmonic component that has an amplitude that is less than a threshold value. Current consumed by the transceiver may be dynamically reduced by selecting an optimized waveform that has low harmonic components.

7 Claims, 6 Drawing Sheets

WAVEFORM CALIBRATION USING BUILT IN SELF TEST MECHANISM

FIELD OF THE INVENTION

Embodiments of this invention generally relate to transceivers for radio frequency transmissions, and in particular, to optimization of waveform shape of high speed clock signals within a transceiver to reduce power consumption.

BACKGROUND OF THE INVENTION

System on Chip (SoC) is a concept that has been around for a long time; the basic approach is to integrate more and more functionality into a given device. This integration can take the form of either hardware or solution software. Many SoC designs pair a microprocessor core, or multiple cores, with various peripheral devices and memory circuits.

A radio frequency (RF) transceiver may be included within a SoC, and may include fully integrated CMOS Low noise amplifiers (LNAs) and power amplifiers (PAs). Differential circuits are often chosen to reduce the effect of ground noise in LNA circuits and double the output power level for PAs under the same supply voltage.

The Bluetooth standard was designed to achieve cost effective wireless communications providing a data rate of 1 Mb/s at 10 m distance. Destined to be primarily a flexible cable replacement, growth in the Bluetooth arena has mushroomed. The specifications for the standard have been relaxed in order to facilitate a fully integrated chipset solution. Therefore this standard is very suitable for an SoC approach. Several platforms are already available on the market for Bluetooth SoC rapid development and prototyping to shorten design cycles and limit the scope of design teams. A Bluetooth RF transceiver requires several system components: a quadrature frequency synthesizer, a low noise amplifier (LNA), mixers to provide frequency translation from RF frequencies to baseband, and amplifiers.

BRIEF DESCRIPTION OF THE DRAWINGS

Particular embodiments in accordance with the invention will now be described, by way of example only, and with reference to the accompanying drawings.

Figure 1:
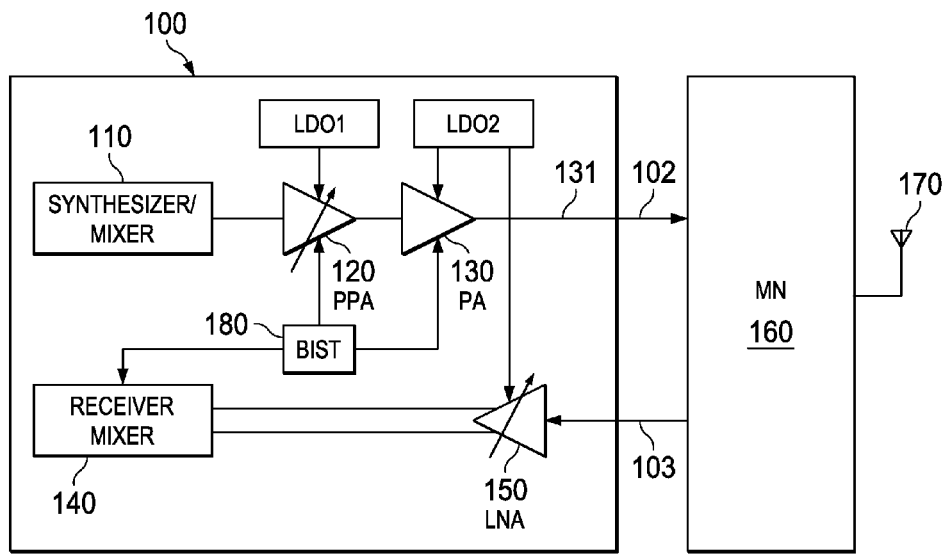
FIG. 1 is a functional block diagram of a portion of a transceiver in a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In recent years, there has been significant interest in the development of low power, low cost transceivers. The most significant current consumption blocks include the PA (power amp) driver in the transmitter signal chain and the RX (receiver) divider buffer in the receiver signal generation chain, as these are usually the broadband loaded blocks. In prior transceiver designs, there is no mechanism to sense the nature of the signal waveforms produced by the PA and the RX divider buffer. For example, depending on driver output power and loading, a waveform that is nearly square, nearly sinusoid or somewhere in-between may be produced. Prior transceiver circuit designs typically utilize an overdesign approach to meet process corners, which is not an optimum design approach.

Testing for regulatory standards' requirements for a wireless transceiver may add significant cost to the overall testing during device manufacture. The transmitter may need to be tested for specification compliance in terms of out-of-band noise and harmonics. Typically, this testing may require special RF (radio frequency) testing hardware, such as a signal analyzer, as well as an RF tester platform.

Embodiments of the invention may use a fully on-chip built-in-self-test calibration mechanism to measure spectral components of a down-converted low frequency signal to obtain information about the waveform produced in the transmitter signal chain, and/or the waveform produced in the receive signal generation chain. This method allows each high frequency signal processing block to be adjusted to precisely consume an optimized amount of current in the transmit and receive modes, as will be described in more detail below.

In principle, if two waveforms F1 and F2 that have different but nearby fundamental frequencies are multiplied (mixed) together, they would generate all the difference tones that are obtained by the difference of each Nth harmonic tone (N=1, 2, ... )

As a simple example, consider F1 as represented by equation (1) and F2 as represented by equation (2). F1*F2 is illustrated by equation (3), for N=1 and 2.

$$F_1 = a_1 \cos(\omega_{TX} t) + a_2 \cos(2\omega_{TX} t) \quad (1)$$

$$F_2 = b_1 \cos(\omega_{RX} t) + b_2 \cos(2\omega_{RX} t) \quad (2)$$

$$F1*F2 = (\omega_{TX} - \omega_{RX}) + (2\omega_{TX} - 2\omega_{RX}) + (2\omega_{TX} - 2\omega_{RX}) + (2\omega_{RX} \pm \pm \omega_{TX}) + (2\omega_{RX} + 2\omega_{TX}) \quad (3)$$

As illustrated by equation (3), the first two terms of F1*F2 produce low frequency components because ω(TX) and ω(RX) are defined to be close together. In the embodiment described herein the fundamental frequency of F2 is twice the fundamental frequency of F1, for example. The rest of the terms produce much higher frequencies. The same analogy can be extended to cover higher harmonics such as $3^{rd}$, $4^{th}$, $5^{th}$ etc. Hence, the terms in the low frequency may be represented by equation (4), where N=1, 2, 3, ....

$$(N^*\omega_{TX} - N^*\omega_{RX}) \text{ where } N=1,2,3,... \quad (4)$$

Typically the transmitter of a radio tends to utilize/provide 50% duty cycle waveforms, and mostly the odd harmonics are present. In the receiver implementation however, both 50% and 25% duty cycle waveforms are used. Harmonic energies of the fundamental frequency are determined by the duty cycle, rise and fall times of the high frequency waveform.

FIG. 1 is a functional block diagram of a portion of a transceiver in a system on chip (SoC) 100 that includes an embodiment of the invention. In addition to the transceiver, which will be described in more detail herein, the SoC may contain other system components such as a processor and memory, various peripheral devices, timers, controllers, etc, that are well known. This embodiment combines receiver (RX) front-end 140 and transmitter (TX) front-end 110. Interface pins 102, 103 couple two transceiver signals from SoC 100 to matching network 160 which in turn couples to antenna 170. Synthesizer and mixer circuit 110 synthesizes a radio frequency from a reference frequency, mixes in data to be transmitted, and provides the modulated RF signal to preamp (PPA) 120, which is further amplified by power amp (PA) 130 and then transmitted on antenna 170. RF signals received on antenna 170 are amplified by low noise amplifier (LNA) 150 and then coupled to receiver mixer circuit 140 for demodulation.

Transmitter front-end preamp 120 and power amp 130 may utilize two-stage, self biased class-AB amplifiers, which may be programmed to operate in a fully differential mode for higher output power and improved filtering, as well as in a single ended mode for lower output power and fewer external components. The two stages can be independently programmed for controlling output power, and the levels of output harmonics (i.e. linearity and efficiency). In this embodiment, power amp 130 is designed to meet appropriate FCC (Federal Communication Commisssion), ETSI (European Telecommunications Standards Institute) and ARIB (Association of Radio Industries and Business) standards for Bluetooth operation.

Output terminal 131 of PA 130 is connected to ESD and matching network 160 via SoC interface pin 102. LNA 150 receives a signal from antenna 170 via SoC interface pin 103 after being filtered by matching network 160.

Bluetooth uses a radio technology called frequency-hopping spread spectrum, which chops up the data being sent and transmits chunks of it on up to 79 bands (1 MHz each; centered from 2402 to 2480 MHz) in the range 2,400-2,483.5 MHz (allowing for guard bands). This range is in the globally unlicensed Industrial, Scientific, and Medical (ISM) 2.4 GHz short-range radio frequency band. It usually performs 800 hops per second, with Adaptive Frequency-Hopping (AFH) enabled. Originally, Gaussian frequency-shift keying (GFSK) modulation was the only modulation scheme available; subsequently, since the introduction of Bluetooth 2.0+ EDR, π/4-DQPSK and 8 DPSK modulation may also be used between compatible devices. Devices functioning with GFSK are said to be operating in basic rate (BR) mode where an instantaneous data rate of 1 Mbit/s is possible. The term Enhanced Data Rate (EDR) is used to describe π/4-DPSK and 8 DPSK schemes, each giving 2 and 3 Mbit/s respectively. The combination of these (BR and EDR) modes in Bluetooth radio technology is classified as a "BR/EDR radio". Various embodiments of the transceiver of FIG. 1 may be designed to support these versions of Bluetooth, as well as other transmission standards such as ANT, ZigBee for example. While embodiments of the invention bring value to ultra low power systems, other embodiments may reduce power consumption of any high speed system.

Built in self-test (BIST) logic 180 may be used to calibrate PPA 120, PA 130, and/or receiver 140 to produce signals having an optimized waveform in order to reduce current consumption when operated in different power modes and to compensate for component aging over time, as will be described in more detail below.

Figure 2:
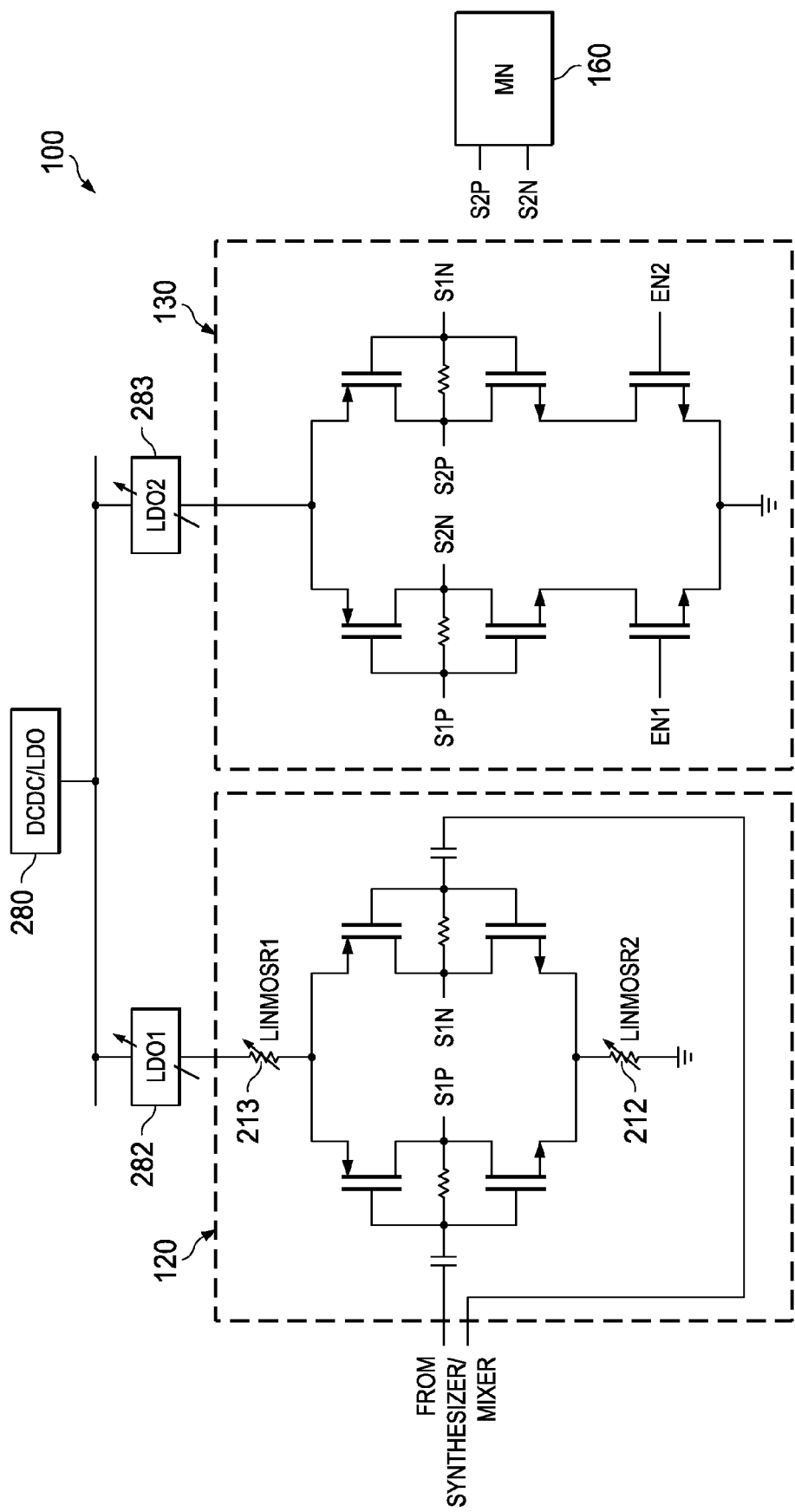
FIG. 2 is a schematic of a self-biased class AB TX driver used in the transceiver of FIG. 1.

FIG. 2 is a schematic of PPA 120 and PA 130 illustrating the self-biased class AB TX drivers used in each one. In a class A amplifier, 100% of the input signal is used. The active element remains conducting and is biased to work in its "linear" range all of the time. Where efficiency is not a consideration, most small signal linear amplifiers are designed as class A. Class-A amplifiers are typically more linear and less complex than other types, but are very inefficient. This type of amplifier is most commonly used in small-signal stages or for low-power applications, such as driving headphones. In a class B amplifier, 50% of the input signal is used and the active element works in its linear range half of the time and is more or less turned off for the other half. In most class B amplifiers, there are two output devices, or sets of output devices, each of which conducts alternately (push-pull) for exactly 180° (or half cycle) of the input signal. These amplifiers are subject to crossover distortion if the transition from one active element to the other is not perfect.

A class AB amplifier is intermediate between class A and B, with better power efficiency than class A and less distortion than class B. The two active elements conduct more than half of the time, producing less cross-over distortion than class-B amplifiers. In this embodiment, preamp 120 is implemented by using self biased class-AB stage with current limiting resistors 212, 213 implemented using an MOS transistor in a linear region. The on-resistance of linear MOS resistors 212, 213 may be controlled by a program executed on a processor within SoC 100 by using a digital codeword to select the gate voltage generated by a string of bias resistors. Using a MOS transistor as a linear variable resistor allows selection of a wide range of resistance. Since the resistance value of the bias resistors is high, power dissipation contributed by the control portion of variable linear MOS resistors 212, 213 is minimized. Also, overall area required for an active MOS variable resistor is less than that required for a variable passive resister. The gain of preamp 120 may be programmed in this manner under control of a software routine executed by a processor included within SoC 100, for example. There are no switching elements in the signal path of the transmitter, leading to a low power implementation. DC to DC converter 280 provides a supply voltage that is used by various modules within SoC 100. Stages 120, 130 are supplied by separately programmable low drop out (LDO) regulators 282, 283, which can be adjusted independently to optimize current consumption and harmonics. Regulators 282, 283 may be programmed in a similar manner to linear MOS resistors 212, 213 under control of a software routine executed by a processor included within SoC 100, for example. Using these controls, the transmitter can be configured for highly linear or highly nonlinear operation, depending on the end application requirements. This suits the need for a variety of emerging standards with demanding modulation techniques.

Figure 3:
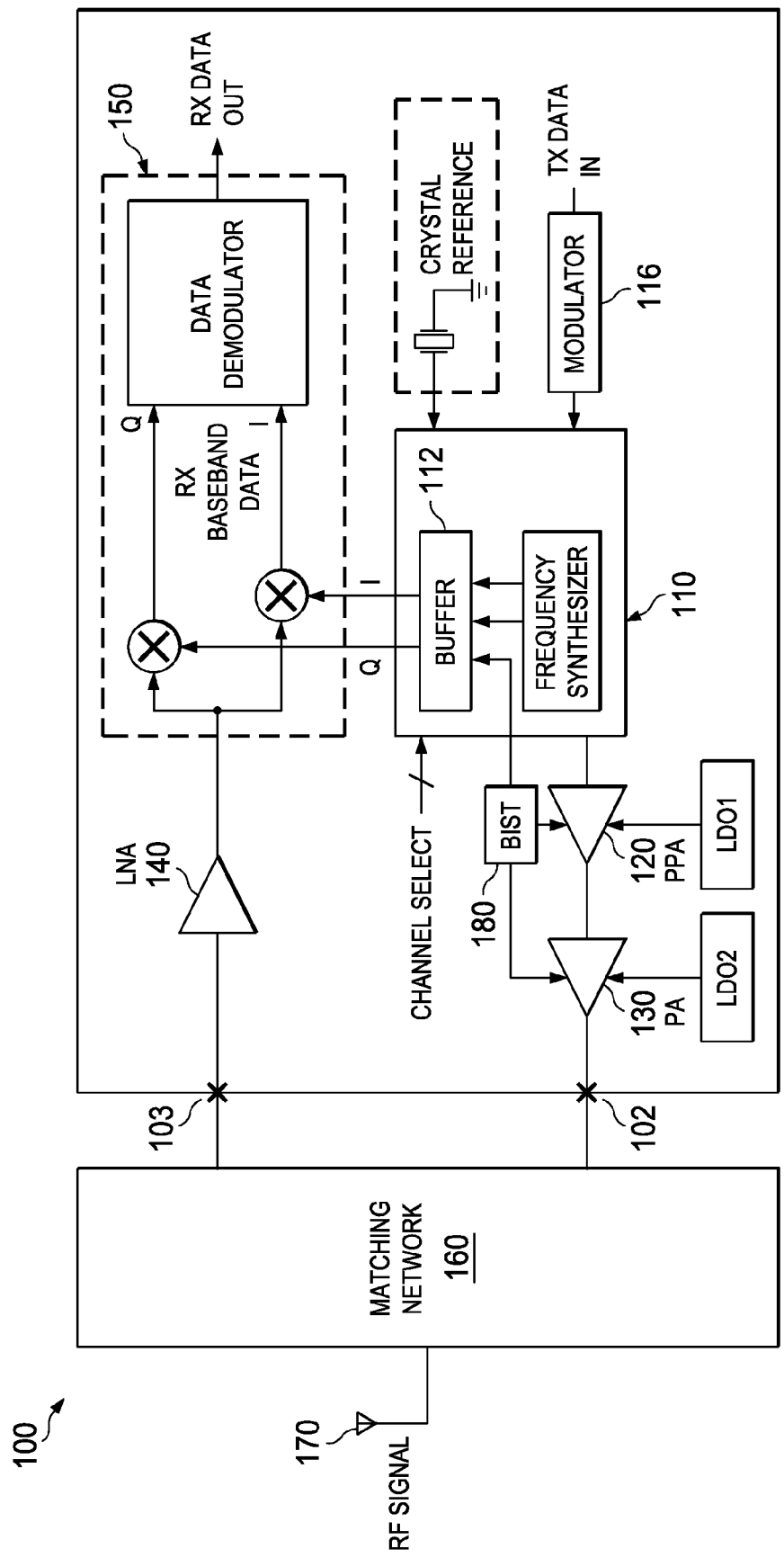
FIG. 3 is a more detailed block diagram of a transceiver module used in the SoC of FIG. 1.

FIG. 3 is a more detailed block diagram of the transceiver module used in the SoC of FIG. 1. An RF transceiver requires several system components: a quadrature frequency synthesizer 110, data modulator 116, a low noise amplifier (LNA) 140, mixer 150 to provide frequency translation from RF frequencies to baseband, and amplifiers 120, 130. Frequency synthesizer 110 may also include a modulator and upmixer, or it may be implemented using a direct modulation architecture in which the data to be transmitted is sent directly to the synthesizer. The general operation of a modulator, quadrature frequency synthesizer and mixers is known, and therefore will not be described in further detail herein. For example, see "A 0.18 um CMOS Bluetooth Frequency Synthesizer for Integration with a Bluetooth SOC Reference Platform", Bogdan Georgescu, et al, 2003, which is incorporated by reference herein.

Calibration may be done anytime, such as at power up of SoC 100, or during operation of SoC to compensate for temperature effects, etc. Typically, the operating mode of PA 130 will remain fixed for a given application; however, some applications may operate PA 130 at one power level for a portion of time and then a control program being executed by a processor on SoC may reconfigure PA 130 to operate in differential mode for a period of time, and vise versa. Each time PA 130 is reconfigured from one power mode to another, it may need to be recalibrated to optimize the waveform that it produces.

Calibration may be performed under control of a software program executed by a processor on the SoC by sending a digital command to transmitter synthesizer 110 to generate a test signal tone having a known frequency, which then produces an RF signal modulated by the known magnitude test tone. In this embodiment, transmitter synthesizer 110 is configured to generate the test tone derived from a crystal reference signal in response to a command from the processor. Other embodiments may use other techniques for generating a test tone and then provide the test tone to the transmitter for use during calibration.

While power amplifier 130 is outputting the RF signal modulated by the test signal, receiver module 150 may monitor the output RF signal and determine the signal strength of down-converted low frequency components. The software program may then cause the gain of power amplifier 130 to be adjusted across a range of values until the amplitude of the down-converted low frequency components fall below a threshold value.

Figure 4:
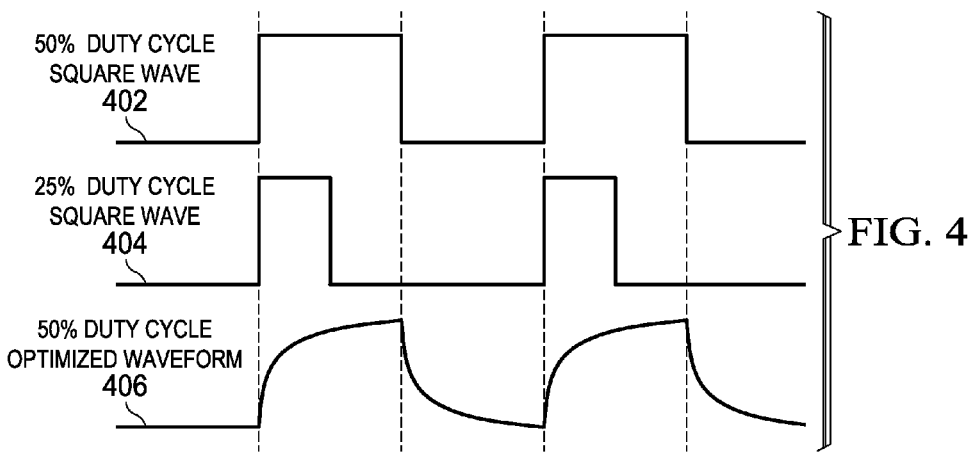
FIG. 4 illustrates example waveforms in a typical radio transceiver system.

FIG. 4 illustrates example waveforms that may be produced by an amplifier or high frequency broadband driver, such as PPA 120, PA 130, or buffer 112, for example. Waveform 402 illustrates a 50% duty cycle square wave, while waveform 404 illustrates a 25% duty cycle square wave. In low power transceiver designs (and medium/high power designs as well), a significant portion of the current consumption budget may be attributed to the power amplifier. In order to achieve the desired output power with the lowest number of external components in matching network 160, there is careful balance/trade-off between harmonic performance and the efficiency of the PA. This in turn may lead to a lower overall solution cost. If the PPA/PA stages are configured to operate with a near square waveform, it may achieve the best efficiency, but the result is very poor harmonic performance and high current consumption due to increased switching activities at RF frequencies. On the other hand, if the waveform is close to a sinusoid and the excursion is always contained within the DC consumption, the current consumption is solely determined by the DC operating point, and the PA achieves best possible harmonic performance but with lowest efficiency. This is not desirable either.

An optimized solution is clearly at some intermediate point between these two extremes. Signal 406 is an example 50% duty cycle optimized waveform signal in which the low frequency components are reduced and total current consumption is thereby optimized.

A further complication is raised by the fact that to address multiple low power wireless standards with different range requirements, the output power needs to be programmable, and this has another effect on PA efficiency. For example, one application may require a maximum output power of 0 dBm and another solution may require a maximum output power of +5 dBm. The main motivation is to extend the battery life to the maximum extent, and if the single IC solution needs to address both the application requirements, and tries to achieve always the lowest current consumption, optimizing waveform is very essential. However, this should be done at low cost in terms of Silicon area and tester cost.

A similar situation occurs in the receiver. Usually the signal chain buffers in the receiver need to drive significantly large capacitive loads and therefore may consume large current. Once again, the square waveform shape provides the lowest conversion loss but consumes the highest current and highest low order (LO) harmonic down conversion. A square wave at frequency F would provide harmonic components at $(2n+1)*F$, where n is an even integer starting from 0. To reduce the harmonic down conversion problem, conventional transceiver architectures tend to use harmonic rejection by a combination of LO phases and/or weighting signal processing components (transistors/resistors/capacitors) associated with each phase. However, they require more area, and precise component matching, and consume additional current due to the routing capacitances. On the other hand, a large sinusoid would save current consumption and provide superior harmonic down conversion while compromising the down conversion efficiency at the fundamental frequency. In addition, the waveform from the frequency dividers are typically neither square, nor sinusoid, but rather are the result of RC delay and may have a waveform similar to optimized waveform 406, for example. These signals typically are approximately 50% duty cycle, as the VCO waveforms are symmetrical and 50% duty cycle. In specific cases 25% duty cycle may also be used (only in receiver) in order to reduce high frequency loading. However, any duty cycle manifests in different harmonic energies, and can be accurately determined by spectral analysis when down-converted at low frequency.

Figure 5:
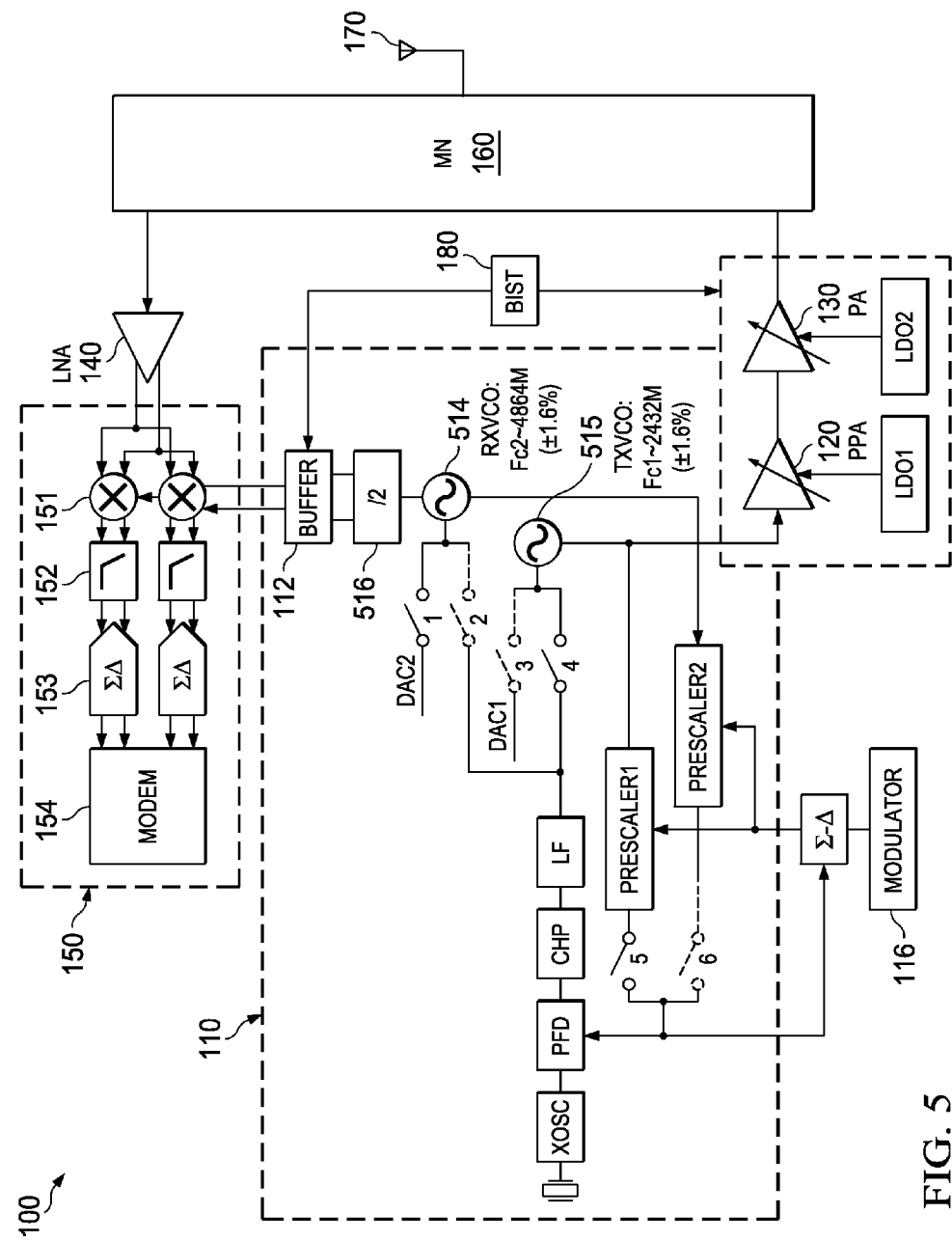
FIG. 5 is a more detailed block diagram of the transceiver of FIG. 1.

FIG. 5 is a more detailed block diagram of the transceiver of FIG. 1. While a single synthesizer is illustrated in FIG. 5, in some embodiments, the base transceiver architecture may use a dual synthesizer approach to reduce TX and RX currents by resonating out the high Q parasitic capacitances (device capacitance and routing capacitance) at high frequency. The dual synthesizers can be programmed differently for transmit and receive. Two independent (physically separate) high speed voltage controlled oscillators 514m 515 are provided; however, only one of them is active in TX and RX. So, for either TX or RX, only one synthesizer is "functionally" active, while the dual synthesizer platform is used for wave-shape calibration. During built-in self-calibration, both oscillators are used simultaneously, one of them may be used in an open loop mode by setting a specific voltage using a digital to analog converter (DAC). Between the TX and RX mode, the only difference is which high frequency oscillator is turned on.

Synthesizer 110 includes a crystal based oscillator (XOSC), a phase frequency detector (PFD), a charge pump (CP), and a loop filter (LF). During normal operation, the synthesizer is operated in a closed loop configuration under control of modulator 116. As described in more detail above, the TX signal path uses two self biased class AB stages 120, 130 which are independently programmed from their local supplies and take signals from voltage controlled oscillator (VCO) 515 operating at the TX frequency. In this embodiment, the transmission frequency is a band of frequencies centered around approximately 2432 MHz, ±1.6%, for use in Bluetooth applications. In the RX, VCO 514 operates at a 2X frequency and divider 516 generates quadrature signals for use by receiver mixer 150. In some embodiments, an auxiliary high bandwidth phase locked loop (PLL) may also be used to improve spectral fidelity. Buffer 112 is used to drive the quadrature signals into the high capacitive load presented by mixer 150. In this embodiment, buffer 112 is configurable in a similar manner as PPA 120 so that it's driving power may be adjusted to thereby allow control of the waveform of the quadrature signals it generates.

To calibrate the TX signal path waveform and its harmonics, the transceiver is placed in a calibration mode under control of built in self-test (BIST) logic 180. An operating amplitude level is selected for PPA 120 and PA 130 by selecting a supply voltage setting for the low dropout regulators LDO1, LD02, as described above. The TX path is then activated using a constant frequency input signal. The RX VCO 514 is configured by switches 1 and 2 to operate in an open loop manner under control of digital to analog converter DAC2, which causes it to generate a frequency that is very close to the TX frequency. Buffer 112 is set to a high power setting so that the waveform of the quadrature signals are near square; at this setting it provides lot of harmonics. If this waveshape is 25% duty cycled, then both odd and even order harmonics would be present, while for a 50% duty cycle waveshape odd order harmonics would be predominant. In another embodiment, a totally independent inverter based driver may also be used to generate a quadrature waveform with rich harmonic contents for use during the calibration process. The current consumption is not important in the calibration phase.

While in the calibration mode, a portion of the constant frequency signal being produced by PA 130 will be input to LNA 140 and then provided to mixer 150. In this manner, two calibration signals that have different but similar fundamental frequencies are input to mixer 150. Mixer 150 then down-converts the two calibration signals using its normal mixing procedure using multipliers 151, low pass filters 152, sigma-delta converters 153 and modem 154.

The resulting down-converted signal is digitized by analog to digital converters (ADC) 153 and then provided to modem 154. In this embodiment, modem 154 is implemented using a digital signal processor (DSP) by executing signal processing software stored in a memory that is coupled to the DSP. An FFT (Fast Fourier Transform) may then be performed on the down-converted signal by the DSP in order to monitor an amplitude of one or more of the low frequency harmonic components produced by mixing the two calibration signals.

In this embodiment, the ADC 153 has a dynamic range of near 63 dB. Assuming near square waveform provided by RX divider buffers 112, the 3rd harmonic (H3) content would be theoretically 9.5 dB below fundamental. In this specific embodiment, it can even work with −20 dBc (decibels relative to the carrier). Hence, if PA 130 generates approximately a −25 dBc H3 performance on-chip before the matching network 160 (~−45 dBc needed by the standard after the off-chip filtering network), the resultant FFT after the RX down-conversion would provide a H3 of −45 dBc. A signal of this magnitude can be easily detected by the MODEM, since in this embodiment ADC 153 provides approximately 63 dB SNDR (signal to noise distortion ratio). Since there are two stages 120, 130 in the PA, individual regulator settings may be adjusted to reduce current until a desired harmonic performance and current consumption is achieved. Usually, the H2 and H3 performances of these amplifiers are correlated, but if an independent measurement of H2 is needed, a 25% duty cycle signal, such as signal 404 illustrated in FIG. 4 may be produced and provided to RX divider buffers 112.

For the receiver (RX) side, calibration of buffer 112 may be performed by programming the TX VCO 515 using switches 3 and 4 to be in an open loop mode under control of DAC1, which causes it to generate a frequency at a well defined value. Then, all the blocks in the RX signal chain and signal generation chain may be activated. Alternately, the configuration used to calibrate the TX side in which the TX VCO 515 is configured to be closed loop and RX VCO 514 is configured to be open loop may also be used. The PA 130 may be programmed to generate a harmonic rich waveform to provide near square waveform. It is very simple to program a self biased class AB amplifier to operate as an inverter, as described in more detail above. The RX buffer 112 current should then be calibrated to provide an optimized waveform that is similar to signal 406.

The overall harmonic rejection in the RX side is a combination of: (a) harmonic rejection from the matching network 160, (b) a transformer of the LNA 140, and (c) basic harmonic rejection from the waveform. In typical conditions, only ~20-30 dBc H3 is achieved from the divider buffer 112, which is a combination of intrinsic divider 516 H3 and the buffer 112 H3. H2 is usually reduced as the waveform is 50% duty cycle and can be further reduced by the common mode rejection of the buffer stage. Hence, a very accurate measurement may be obtained by injecting a tone produced by the TX side at the mixer input, adjusting the amplitude of the buffer 112 across a range of power levels while monitoring an amplitude of one or more of the low frequency components by performing an FFT, and selecting an operating power for the adjustable power buffer 112 for which the amplitude of the one or more low frequency components, such as H3, is below a threshold value. In this manner, the wave-shape of the constant frequency signal produced by buffer 112 is optimized.

In this embodiment, a spectral analysis may be performed in the modem 154 by using an FFT engine provided by modem 154, or it may be performed by a separate digital signal processing block that receives digital data from modem 154, for example. The spectral analysis may be completed in less than 1 mS for each setting of adjustable buffer 112 when calibrating the RX side and for each setting of PPA 120 and PA 130 while calibrating the TX side. This provides very low cost spectral analysis and provides significant advantages for calibrating the amplifiers, as described above.

Since the calibration is performed as a fully on-chip solution, calibration may be performed anytime during the product life cycle. This may allow component aging effects to be compensated over the life of the product. The calibration time is short, leading to very low cost during the manufacturing process. There is no need to use expensive RF test equipment on production line testers In many embodiments, a critical aspect of a transmitter that is compliant with a protocol standard is compliance in terms of out-of-band harmonics. Embodiments may be easily tested without any expensive hardware using the techniques described herein to assure compliance with a selected protocol standard. Furthermore, matching network 160 may be simplified in some embodiments to reduce external components and still be standards compliant. For example, in some embodiments, a simple single inductor and single capacitor may be used to form a low cost matching network 160.

In this manner, low power may be achieved by calibrating signal waveforms in the TX chain and in the RX chain using a fully on-chip method that requires essentially no additional on-chip circuitry. Therefore, there is no need to overdesign the existing circuits. Since this simple scheme is based on down-conversion, there is no need for extensive memory or additional high frequency signal processing circuitry.

Figure 6:
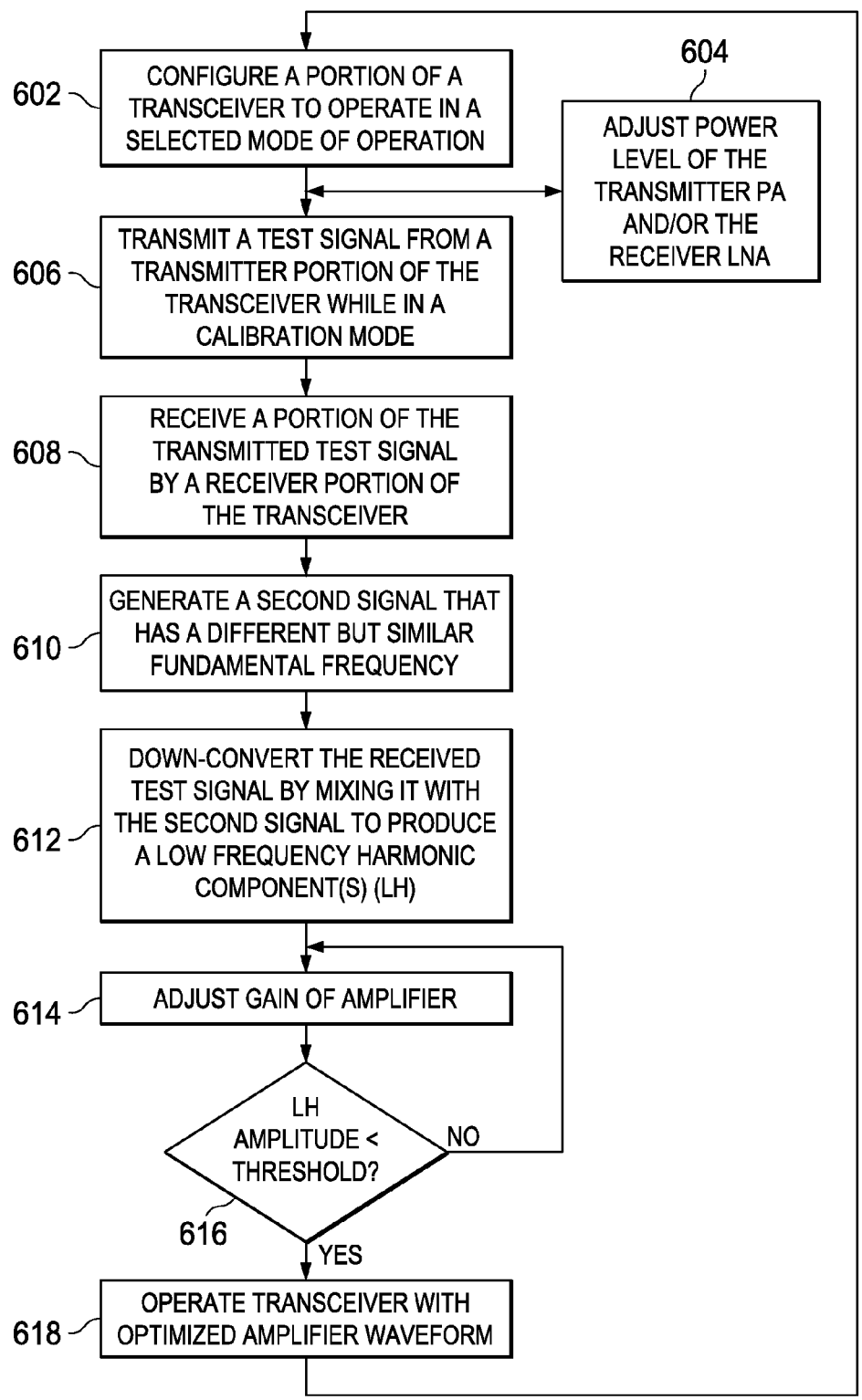
FIG. 6 is a flow diagram illustrating calibration of a transceiver with programmable amplifiers.

FIG. 6 is a flow diagram illustrating calibration of a transceiver with programmable amplifiers, such as PPA 120, PA 130 and receiver buffer 112, for example. At some point in time, such as at power up of the SoC containing the transceiver, or during continuing operation of the SoC when an application being executed by a processor on the SoC has a need to change an operating mode of the transceiver, for example, a portion of the transceiver may be configured 602 to operate in the selected mode of operation. For each selected mode of operation, power levels of transmitter PPA or PA and/or the receiver LNA and associated quadrature signal buffers may be adjusted 604. For example, in some embodiments the power amplifier of the transmitter may be configured to operate in a single ended mode of operation for lower power operation, but may be configured to operate for a while in a differential mode of operation to provide increased transmission power. Similarly, in some embodiments the receiver LNA may be configured to operate in either a single ended mode of operation or in a differential mode of operation.

In this embodiment, a microprocessor based built in self test (BIST) module is controllably coupled to the power amplifier, quadrature buffers and to various other functional units of the transceiver. Code executed by the microprocessor may be operable to configure the transmitter power amplifier gain at various power levels by adjusting the output voltage of associated voltage regulators, for example. Code executed by the microprocessor may be operable to adjust the gain by changing the resistance of a various bias resistors, as described above in more detail. Similarly, code executed by the microprocessor may be operable to configure the low noise amplifier to operate at various sensitivity levels and to adjust the power level of the quadrature signal buffer to match the LNA.

A calibration process may then be performed under control of the BIST module to optimize signal waveforms in order to reduce current consumption for the selected mode of operation. During the calibration process, a constant frequency test tone may be transmitted 606 from a transmitter portion of the transceiver via an antenna coupled to the SoC via a matching network.

The transmitted test tone may be monitored 608 by a receiver portion of the transceiver to produce a received test tone signal. During normal operation, the receiver is turned off while the transmitter is operating. Since the transmitter output signal is coupled to the receiver LNA input via the matching network, the output signal may swamp the input of the LNA, depending on the attenuation characteristics of the matching network. To avoid this, the output signal level of the power amplifier may need to be biased so as not to break down the semiconductor devices of the LNA.

A second constant frequency signal having a different but similar fundamental frequency as the first constant frequency signal is generated 610 in a receiver portion of the transceiver. As described above in more detail, this may be done by using the quadrature signal produced by a frequency synthesizer for use by the receiver.

The received portion of the first constant frequency signal is down-converted 612 by mixing it with the second constant frequency signal to produce low frequency harmonic components that are indicative of a wave-shape of the transmitted constant frequency signal. As described in more detail above with regard to equation (3) and (4), these signals will typically be indicative of the second, third or higher harmonics of the test signal. An FFT (Fast Fourier Transform) may then be performed on the down-converted signal by a DSP in order to monitor amplitude of one or more of the low frequency harmonic components produced by mixing the two calibration signals.

The gain of the power amplifier may be adjusted 614 across a range of power levels while monitoring an amplitude of one or more of the low frequency components. When the amplitude of the one or more low frequency components fall below a threshold value 616, then the corresponding gain for the adjustable power amplifier may be selected and used to operate 618 the transceiver. The threshold value may be a fixed value that preselected, for example, or a threshold value may be selected dynamically by determining a minimum amplitude value as the power amplifier is adjusted across the range of power levels, for example. In this manner, the wave-shape of the signal produced by the power amplifier may be optimized in order to reduce current use.

The process may be used to calibrate a power amplifier in the transmitter portion of a transceiver by adjusting the gain of the power amplifier across a range of values until the amplitude of the one or more low frequency components falls below a threshold value. Similarly, the process may be used to calibrate a buffer used in the receiver portion of a transceiver by adjusting the gain of the buffer across a range of values until the amplitude of the one or more low frequency components falls below a threshold value.

This process may be performed each time the SoC is booted up after a power off period. By optimizing the setting of the amplifiers each time the SoC is powered on, effects from aging of components can be compensated, for example.

As described in more detail above, this process may be performed to calibrate one or more of preamp 120, power amp 130, and/or quadrature signal buffer 112 of transceiver 100, for example.

Alternate Configurations

As mentioned earlier, the transmitter in the embodiment described herein may be configured to operate in either a single ended or in differential mode of operation. In this manner, the operating amplitude level of the power amplifier may be selected from a wide range of amplitude levels. Similarly, the receiver may be configured to operate in either a single ended or in a differential mode of operation. Various combinations of operating modes may then produce different low frequency harmonic components during the calibration process. For example, the transmitter and receiver may both be supplied with 50% duty cycle, thus the down-converted energy is in the odd-order harmonics, and the signal from the transmitter may be coupled to the receiver in a fully differential manner.

In another combination, the transmitter and receiver are both supplied with 50% duty cycle, thus the down-converted energy is in the odd and even-order harmonics, and the signal from the transmitter is coupled to the receiver in a single ended manner.

In another combination, the transmitter is supplied with 50% duty cycle while the receiver is supplied with 25% duty cycle in calibration mode (but uses 50% in normal operating mode), thus the down-converted energy is in the odd and even-order harmonics, and the signal from the transmitter is coupled to the receiver in either single ended or differential manner.

Selectable operation of a transceiver in differential and single ended mode is described in more detail in U.S. patent application Ser. No. 13/748,008 to Sudipto Chakraborty et al, filed Jan. 23, 2013, entitled "Transceiver with Asymmetric Matching Network," and is incorporated by reference herein.

When the dynamic range of the ADC is much larger (~80-90 dB), the following combinations would also be useful for reducing current while meeting end targets:

(a) Programming the transmitter PA in linear mode (providing near sinusoidal waveshape) and programming the RX waveshape in near sinusoidal mode;

(b) Programming the transmitter PA in linear mode (providing near sinusoidal waveshape) and programming the RX waveshape in near square waveshape mode;

(c) Programming the transmitter PA in saturated mode (providing near square waveshape) and programming the RX waveshape in near sinusoidal mode; and (d) Programming the transmitter PA in saturated mode (providing near square waveshape) and programming the RX waveshape in near square waveshape, for example.

Since the amplifiers in the transmitter (TXPA) are similar to inverter/buffer configuration, an alternate calibration mode may also be obtained by providing the PA with 50% duty-cycle waveform so that linearity of the PA can be evaluated in more details. Such a configuration may be enabled by providing a 25% duty cycle generator intended for calibration purposes only. Alternatively, the outputs of 25% duty-cycle generator in the RX may be coupled to the TX PA in the calibration mode requiring no additional hardware. 25% duty cycle generation is a block whose input is 50% duty cycle (that contains only odd-order harmonics) while the output is 25% duty cycle (containing both odd and even order harmonics). This selective coupling may lead to a wide variety of low cost BIST techniques to reduce power.

System Example

Figure 7:
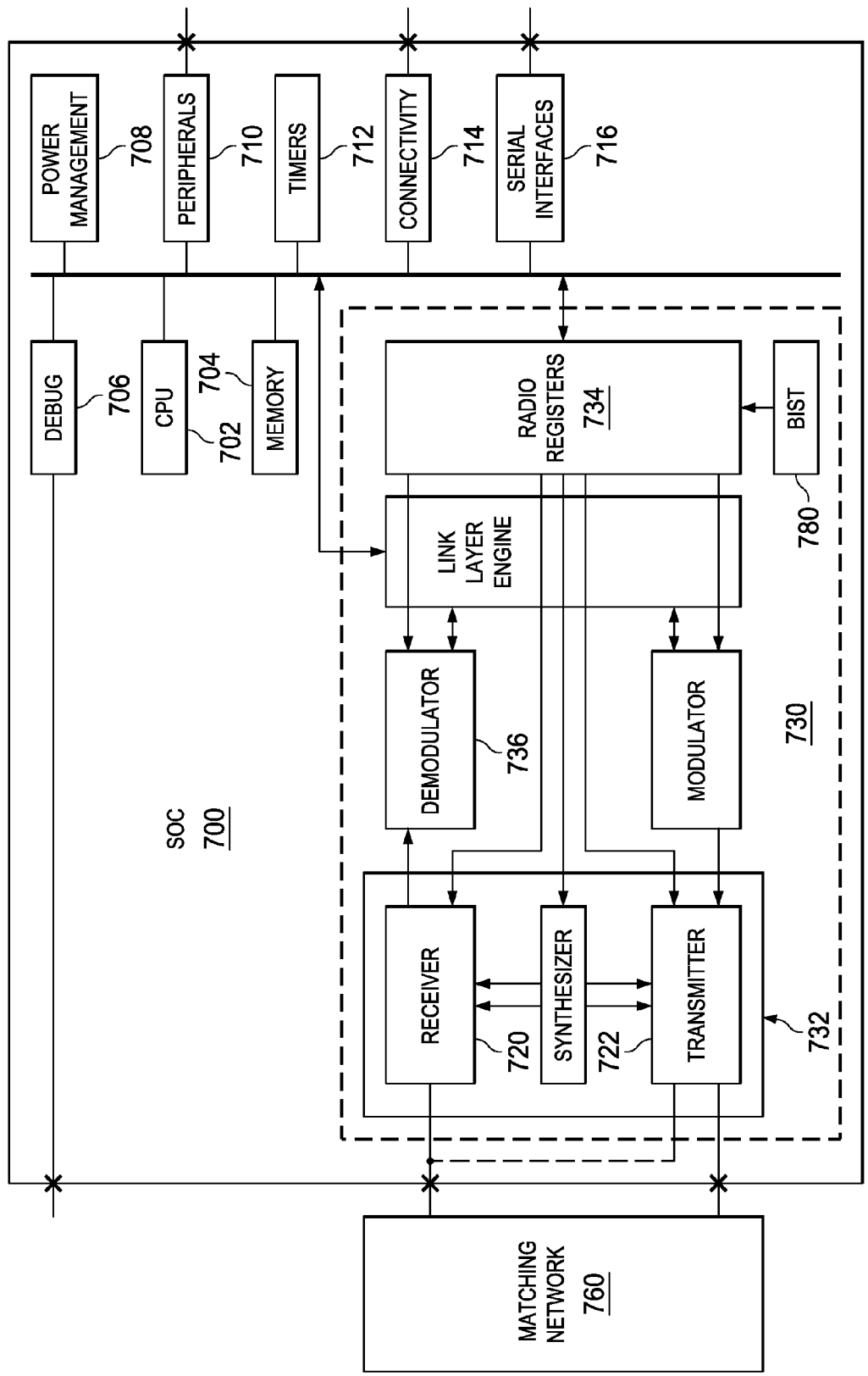
FIG. 7 is a block diagram of an example SoC that includes a configurable transceiver.

FIG. 7 is a block diagram of an example SoC 700 that includes digital radio 730 that includes a Bluetooth transceiver 732. Transceiver 732 includes adjustable amplifiers and buffers that may be calibrated to reduce current usage as described in more detail above. Calibration may be performed by writing control words into radio control registers 734 under control of BIST module 780. Demodulation logic 736 may contain a digital signal processor that may be configured to perform FFT computations during the calibration process on digital data received via receiver 720. A software application stored in memory 704 and executed by processor 702 may control and configure the digital radio as needed by applications executed thereon. The general operation of a Bluetooth radio is known, and therefore will not be described in further detail herein. Matching network 760 is similar to the matching network described earlier.

BIST module 780 may be configured to control a calibration mode that allows various amplifiers and buffers within transceiver 732 to be calibrated to produce signal waveforms similar to 406, referring again to FIG. 4, that are optimized to reduce current consumption by the amplifiers and buffers. Calibration may be performed at power up or during periods of extended operation in order to compensate for component aging, for example. Calibration may be performed by generating a first constant frequency signal using an adjustable power amplifier, generating a second constant frequency signal having a different but similar fundamental frequency as the first constant frequency signal, down-converting a portion of the first constant frequency signal using the second constant frequency signal to produce low frequency components indicative of a wave-shape of the first constant frequency signal, adjusting the power amplifier across a range of power levels while monitoring an amplitude of one or more of the low frequency components, and selecting an operating power for the adjustable power amplifier for which the amplitude of the one or more low frequency components is below a threshold value. In this manner, the wave-shape of the first constant frequency signal may be optimized.

SoC 700 may include additional system components to provide a complete system on a chip. For example, a debug interface 706 that implements a JTAG serial interface, for example, may be used for in-circuit debugging. Through this debug interface, it may be possible to erase or program the entire flash memory 704, control which oscillators are enabled, stop and start execution of the user program, execute instructions on the processor core 702, set code breakpoints, and single-step through instructions in the code, for example.

In this embodiment, I/O controller 714 is responsible for all general-purpose I/O pins. CPU (central processing unit) 702 may configure whether peripheral modules control certain pins or whether they are under software control, and if so, whether each pin is configured as an input or output and if a pullup or pulldown resistor in the pad is connected. Each peripheral that connects to the I/O pins can choose between two different I/O pin locations to ensure flexibility in various applications.

Various timers 712 may be included. A built-in watchdog timer allows SoC 700 to reset itself if the firmware hangs. When enabled by software, the watchdog timer must be cleared periodically; otherwise, it resets the device when it times out. Additional timers may be provided for use in timing, counting, and pulse width modulation tasks, for example.

Serial interfaces 712 may include one or more universal serial asynchronous receiver/transmitters. Various peripherals 710 may be included within SoC 700. For example, in some embodiments there may be an AES encryption/decryption core that allows the user to encrypt and decrypt data using the AES algorithm with 128-bit keys, for example.

Other combinations of known and later developed peripherals and support modules may be included in various embodiments of SoC 700.

Other Embodiments

Although the invention finds particular application to microcontrollers implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, an embodiment described herein was implemented in 130 nm CMOS, but is scalable with respect to technology of implementation as well as the RF center frequencies of common wireless standards and frequency bands.

While the embodiments described herein place the matching network external to the SoC, systems that operate at higher frequencies may be able to include the matching network components internal to the SoC since the components may be smaller at higher frequencies.

While Bluetooth transceivers have been referred to herein, embodiments of the invention are not limited to standard Bluetooth. Other embodiments may be used in low power communication systems such as BLE (Bluetooth Low Energy, v4 of the standard); ANT; ZigBee (IEEE802.15.4); BAN (IEEE802.15.6), etc. Low Power systems are used in small devices: bulb; dongle; monitors for sport (e.g. running sensor); etc. These systems are typically inexpensive devices and need to use a minimum of BOM (Bill Of Material), which may be provided by using an adjustable transmit amplifier as described herein.

Embodiments of this disclosure may provide low cost and low power at competitive dynamic ranges with current consumption scalable with respect to dynamic range. This allows a low cost device while retaining significant programmability for multiple applications. Bluetooth provides a secure way to connect and exchange information between devices such as faxes, mobile phones, telephones, laptops, personal computers, printers, Global Positioning System (GPS) receivers, digital cameras, video game consoles, health monitoring devices, etc.

Wireless LAN applications (802.11a/b/g) have a longer range (30-meter) and higher data rate than Bluetooth applications. For 802.11b/g, the direct-sequence spread spectrum (DSSS) is used so that WLAN applications won't interfere with Bluetooth applications in the same frequency range. The orthogonal frequency division multiplexing (OFDM) modulation scheme is used in 802.11a and g to achieve a high data rate, with a stringent requirement on transmitter linearity due to the large peak-to-average ratio of the OFDM modulation. The output power level is medium (around 20 dBm) to cover the 30-meter range with a high data rate. As the demand for wireless multimedia data transmission grows higher, some wide-band technologies and new standards have evolved. Among them are multiple-input multiple-output (MIMO), Ultra-Wide Band (UWB), and Worldwide Interoperability for Microwave Access (WiMAX/802.16). Aspects of the present disclosure may be used in embodiments of transceivers designed for these additional standards and other standards as well.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for operating a transceiver on a chip, the method comprising:
    performing a calibration procedure comprising:
        generating first constant frequency signal using an adjustable power amplifier in a transmitter portion of the transceiver at a selected operating amplitude level;
        generating a second constant frequency signal having a different but similar fundamental frequency as the first constant frequency signal in a receiver portion of the transceiver;
        receiving a portion of the second constant frequency signal in the receiver portion of the transceiver;
        down-converting the received portion of the first constant frequency signal using the second constant frequency signal to produce low frequency harmonic components indicative of a wave-shape of the first constant frequency signal;
        adjusting the power amplifier across a range of power levels while monitoring an amplitude of one or more of the low frequency harmonic components; and
        selecting an operating power for the adjustable power amplifier for which the amplitude of the one or more low frequency harmonic components is below a threshold value, whereby the wave-shape of the first constant frequency signal is optimized;
    wherein the calibration procedure further comprises: generating a third constant frequency signal using a power amplifier in the transmitter portion of the transceiver;
        generating a fourth constant frequency signal having a different but similar fundamental frequency as the first constant frequency signal using an adjustable power buffer;
        receiving a portion of the third constant frequency signal in the receiver portion of the transceiver;
        down-converting the received portion of the amplified constant frequency signal using the fourth constant frequency signal to produce second low frequency harmonic components indicative of the wave-shape of the fourth amplified constant frequency signal;
        adjusting the amplitude of the buffer across a range of power levels while monitoring an amplitude of one or more of the second low frequency harmonic components; and
        selecting an operating power for the adjustable power buffer for which the amplitude of the one or more second low frequency harmonic components is below a threshold value, whereby the wave-shape of the fourth constant frequency signal is optimized.

2. A method for operating a transceiver on a chip, the method comprising:
    placing the transceiver in a calibration mode, wherein the transceiver comprises a transmitter having a power amplifier and a receiver having a signal buffer, wherein at least one of the transmitter and receiver has a configurable portion that can be configured to produce a range of waveforms;
    calibrating the configurable portion of the transceiver to produce a waveform that has a selected harmonic component that has an amplitude that is less than a threshold value while operating at a selected operating amplitude by:
down-converting a portion of a signal produced by the configurable portion to produce low frequency harmonic components indicative of a wave-shape of the signal; and
selecting an operating power for the configurable portion for which the amplitude of the one or more low frequency harmonic components is below the threshold value;
operating the transceiver using the selected operating power for the configurable portion; and
selecting an operating amplitude level for the configurable portion prior to calibrating the configurable portion.

3. A method for operating a transceiver on a chip, the method comprising:
placing the transceiver in a calibration mode, wherein the transceiver comprises a transmitter having a power amplifier and a receiver having a signal buffer, wherein at least one of the transmitter and receiver has a configurable portion that can be configured to produce a range of waveforms;
calibrating the configurable portion of the transceiver to produce a waveform that has a selected harmonic component that has an amplitude that is less than a threshold value while operating at a selected operating amplitude by:
down-converting a portion of a signal produced by the configurable portion to produce low frequency harmonic components indicative of a wave-shape of the signal; and
selecting an operating power for the configurable portion for which the amplitude of the one or more low frequency harmonic components is below the threshold value;
further comprising:
operating the transceiver for a period of time using the selected operating amplitude level; and
changing the selected operating amplitude level of the power amp and repeating the calibration procedure.

4. A method for operating a transceiver on a chip, the method comprising:
placing the transceiver in a calibration mode, wherein the transceiver comprises a transmitter having a power amplifier and a receiver having a signal buffer, wherein at least one of the transmitter and receiver has a configurable portion that can be configured to produce a range of waveforms;
calibrating the configurable portion of the transceiver to produce a waveform that has a selected harmonic component that has an amplitude that is less than a threshold value while operating at a selected operating amplitude by:
down-converting a portion of a signal produced by the configurable portion to produce low frequency harmonic components indicative of a wave-shape of the signal; and
selecting an operating power for the configurable portion for which the amplitude of the one or more low frequency harmonic components is below the threshold value;
wherein calibrating the configurable portion further comprises:
generating first constant frequency signal using an adjustable power amplifier in a transmitter portion of the transceiver at the selected operating amplitude level;
generating a second constant frequency signal having a different but similar fundamental frequency as the first constant frequency signal in a receiver portion of the transceiver;
receiving a portion of the second constant frequency signal in the receiver portion of the transceiver;
down-converting the received portion of the first constant frequency signal using the second constant frequency signal to produce low frequency harmonic components indicative of a wave-shape of the first constant frequency signal;
adjusting the power amplifier across a range of power levels while monitoring an amplitude of one or more of the low frequency harmonic components; and
selecting an operating power for the adjustable power amplifier for which the amplitude of the one or more low frequency harmonic components is below the threshold value, whereby the wave-shape of the first constant frequency signal is optimized.

5. A method for operating a transceiver on a chip, the method comprising:
placing the transceiver in a calibration mode, wherein the transceiver comprises a transmitter having a power amplifier and a receiver having a signal buffer, wherein at least one of the transmitter and receiver has a configurable portion that can be configured to produce a range of waveforms;
calibrating the configurable portion of the transceiver to produce a waveform that has a selected harmonic component that has an amplitude that is less than a threshold value while operating at a selected operating amplitude by:
down-converting a portion of a signal produced by the configurable portion to produce low frequency harmonic components indicative of a wave-shape of the signal; and
selecting an operating power for the configurable portion for which the amplitude of the one or more low frequency harmonic components is below the threshold value;
wherein calibrating the configurable portion further comprises:
generating first constant frequency signal using a power amplifier in a transmitter portion of the transceiver;
generating a second constant frequency signal having a different but similar fundamental frequency as the first constant frequency signal using an adjustable power buffer;
receiving a portion of the first constant frequency signal in a receiver portion of the transceiver;
down-converting the received portion of the amplified constant frequency signal using the second constant frequency signal to produce low frequency components indicative of the wave-shape of the second amplified constant frequency signal;
adjusting the amplitude of the buffer across a range of power levels while monitoring an amplitude of one or more of the low frequency components; and
selecting an operating power for the adjustable power buffer for which the amplitude of the one or more low frequency components is below a threshold value, whereby the wave-shape of the second constant frequency signal is optimized.

6. A system on a chip (SoC) comprising:
a transceiver comprising a transmitter having a power amplifier and a receiver having a signal buffer, wherein at least one of the transmitter and receiver has a configurable portion that can be configured to produce a range of waveforms; and built in self test (BIST) logic coupled to the transceiver, wherein the BIST logic is operable to calibrate the configurable portion of the transceiver to produce a waveform that has a selected harmonic component that has an amplitude that is less than a threshold value, whereby current consumed by the transceiver is reduced;

a microprocessor controllably coupled to the power amplifier, wherein code executed by the microprocessor is operable to calibrate the power amplifier to produce a waveform that has a selected harmonic component that has an amplitude that is less than a threshold value;

wherein the configurable portion of the transceiver is the transmitter portion, wherein the power amplifier of the transmitter is operable to be configured to operate at different power levels;

wherein the power amplifier comprises a preamp stage having an adjustable gain and a first adjustable supply voltage and an output stage having a second adjustable supply voltage; and wherein the power amplifier is configurable to operate linearly or nonlinearly by adjusting the preamp gain and the first and second supply voltages.

7. A system on a chip (SoC) comprising:

a transceiver comprising a transmitter having a power amplifier and a receiver having a signal buffer, wherein at least one of the transmitter and receiver has a configurable portion that can be configured to produce a range of waveforms; and built in self test (BIST) logic coupled to the transceiver, wherein the BIST logic is operable to calibrate the configurable portion of the transceiver to produce a waveform that has a selected harmonic component that has an amplitude that is less than a threshold value, whereby current consumed by the transceiver is reduced;

wherein the BIST logic is operable to calibrate the transceiver by:

configuring the transmitter to generate a first constant frequency signal with the power amplifier at a selected operating amplitude level;

configuring the receiver to generate a second constant frequency signal having a different but similar fundamental frequency as the first constant frequency signal, receive a portion of the second constant frequency, and down-convert the received portion of the first constant frequency signal using the second constant frequency signal to produce low frequency harmonic components indicative of a wave-shape of the first constant frequency signal;

adjusting the power amplifier across a range of power levels while monitoring an amplitude of one or more of the low frequency harmonic components; and selecting an operating power for the adjustable power amplifier for which the amplitude of the one or more low frequency harmonic components is below a threshold value.

* * * * *